United States Patent
Xu et al.

(10) Patent No.: US 9,837,562 B2
(45) Date of Patent: Dec. 5, 2017

(54) CAPACITIVELY COUPLED ELECTRODELESS PLASMA APPARATUS AND A METHOD USING CAPACITIVELY COUPLED ELECTRODELESS PLASMA FOR PROCESSING A SILICON SUBSTRATE

(71) Applicant: NANYANG TECHNOLOGICAL UNIVERSITY, Singapore (SG)

(72) Inventors: Shuyan Xu, Singapore (SG); Chia Sern Chan, Singapore (SG); Luxiang Xu, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/764,174

(22) PCT Filed: Feb. 28, 2014

(86) PCT No.: PCT/SG2014/000097
§ 371 (c)(1),
(2) Date: Jul. 29, 2015

(87) PCT Pub. No.: WO2014/133465
PCT Pub. Date: Sep. 4, 2014

(65) Prior Publication Data
US 2015/0372167 A1   Dec. 24, 2015

Related U.S. Application Data

(60) Provisional application No. 61/770,737, filed on Feb. 28, 2013, provisional application No. 61/834,217, filed on Jun. 12, 2013.

(51) Int. Cl.
*H01L 21/67* (2006.01)
*H01L 21/687* (2006.01)
(Continued)

(52) U.S. Cl.
CPC ........ *H01L 31/02366* (2013.01); *C23C 16/24* (2013.01); *C23C 16/505* (2013.01);
(Continued)

(58) Field of Classification Search
CPC ......... H01L 21/76874; H01L 31/02366; H01L 21/76856; C23C 18/1633; H01J 37/32091
(Continued)

(56) References Cited

U.S. PATENT DOCUMENTS 5,308,791 A * 5/1994 Horiike ............. H01L 21/02046
134/1
5,614,055 A * 3/1997 Fairbairn .............. H01J 37/321
118/723 AN
(Continued)

FOREIGN PATENT DOCUMENTS

WO        2014133465 A1    9/2014

OTHER PUBLICATIONS

Foreign Communication From a Related Counterpart Application, International Search Report and Written Opinion dated May 21, 2014, International Application No. PCT/SG2015/000097 filed on Feb. 28, 2014.

(Continued)

*Primary Examiner* — Moazzam Hossain

(57) ABSTRACT

There is provided a capacitive coupled electodeless plasma apparatus for processing a silicon substrate. The apparatus includes at least one inductive antenna driven by time-varying power sources for providing at least one electrostatic field; and a chamber for locating the silicon substrate. There is also provided a method for processing a silicon substrate using capacitively coupled electrodeless plasma.

14 Claims, 7 Drawing Sheets

(51) Int. Cl.
H01L 31/02 (2006.01)
H01J 37/32 (2006.01)
C23C 16/505 (2006.01)
H01L 31/0236 (2006.01)
C23C 16/507 (2006.01)
H01L 31/18 (2006.01)
H01L 31/20 (2006.01)
C23C 16/24 (2006.01)

(52) U.S. Cl.
CPC ........ *C23C 16/507* (2013.01); *H01J 37/3211* (2013.01); *H01J 37/32091* (2013.01); *H01J 37/32146* (2013.01); *H01L 21/67069* (2013.01); *H01L 31/0236* (2013.01); *H01L 31/02363* (2013.01); *H01L 31/18* (2013.01); *H01L 31/1804* (2013.01); *H01L 31/1868* (2013.01); *H01L 31/202* (2013.01); *Y02E 10/50* (2013.01); *Y02P 70/521* (2015.11)

(58) Field of Classification Search
USPC ...................................... 156/345.48; 438/478
See application file for complete search history.

(56) References Cited

U.S. PATENT DOCUMENTS

| | | | | |
|---|---|---|---|---|
| 5,619,103 A * | 4/1997 | Tobin | ................... | H01J 37/321 204/298.08 |
| 5,800,619 A * | 9/1998 | Holland | ................ | H01J 37/321 118/723 I |
| 5,998,931 A | 12/1999 | Donohoe | | |
| 6,096,564 A * | 8/2000 | Denes | ....................... | A61L 2/14 438/1 |
| 6,204,604 B1 * | 3/2001 | Donohoe | .............. | H01J 37/321 118/723 I |
| 2003/0046976 A1 * | 3/2003 | Hanazaki | ............... | G01N 21/68 73/23.21 |
| 2004/0038486 A1 * | 2/2004 | Chua | .................... | H01J 37/321 438/287 |
| 2008/0178805 A1 * | 7/2008 | Paterson | ........... | H01J 37/32091 118/723 I |
| 2011/0284167 A1 * | 11/2011 | Nishio | .................. | H01J 37/321 156/345.35 |
| 2014/0377958 A1 * | 12/2014 | Tanaka | .............. | H01L 21/02071 438/710 |
| 2016/0198558 A1 * | 7/2016 | Chan | .................... | H05H 1/0037 356/72 |

OTHER PUBLICATIONS

"Vacuum Coating Equipment" http://www.shi.co.jp/english/products/semicon/vacuum/index.html.

Howard M. Branz, Vernon E. Yost, Scott Ward, Kim M. Jones, Bobby To and Paul Stradinset,"Nanostructured black silicon and the optical reflectance of graded-density surfaces", Applied Physics Letters, vol. 94, 23 (2009).

M. Y. Shen, C. H. Crouch, J. E. Carey and E. Mazur, "Femtosecond laser-induced formation of submicrometer spikes on silicon in water", Applied Physics Letters, vol. 85, 23 (Dec. 6, 2004).

B.M.Damiani, R.Lüdemann, D.S.Ruby, S.H.Zaidi, A.Rohatgi, "Development of RIE-textured silicon solar cells", Photovoltaic Specialists Conference, 2000. Conference Record of the Twenty-Eighth IEEE, pp. 371-374 (Sep. 15-22, 2000).

H. Jansen et al, "The black silicon method. VIII. A study of the performance of etching silicon using SF6/O2-based chemistry with cryogenical wafer cooling and a high density ICP source," Microelectronics Journal, vol. 32, pp. 769-777 (2001).

S. Xu, C.S. Chan and L.X. Xu, "Capacitive Coupled Electrodeless Plasma (CCEP) for Soft Plasma Processing", U.S. Appl. No. 61/770,737.

* cited by examiner

|  | Alkaline | Acidic | MW-ICP | CCEP |
|---|---|---|---|---|
| (a) Textured Profile |  |  |  |  |
| (b) KPI of Texturing | | | | |
| 1. Textured surfaces | Double | Double | Single | Single |
| 2. Residue removal (LID problem) | Complete | Incomplete | Nil | Nil |
| 3. Light reflectance | 20-40% | 20-40% | 15-40% | 4-25% |
| 4. Aspect ratio of textured profile | Medium | Medium | High | Low |
| 5. Surface damage | Low | Low | High | Low |
| (c) Industrial Concerns | | | | |
| 1. Wafer/Water/Chemical Wastage | High | High | Nil | Nil |
| 2. Silicon Type | Mono- | Multi- | Mono/Multi- | Mono/Multi- |
| 3. Equipment Footprint | >20 Meters | >20 Meters | <5 Meters | <5 Meters |

Figure 9

| Process Parameter | Value |
|---|---|
| RF input power | 100 W – 1000 W |
| Working Pressure | 1 Pa – 100 Pa |
| Gas Ratio of $SiH_4:H_2$ | 1:1 to 1:10 |
| Substrate Temperature | Room Temperature to 250 °C |

CAPACITIVELY COUPLED ELECTRODELESS PLASMA APPARATUS AND A METHOD USING CAPACITIVELY COUPLED ELECTRODELESS PLASMA FOR PROCESSING A SILICON SUBSTRATE

CROSS-REFERENCE TO RELATED APPLICATIONS

This application is a filing under 35 U.S.C. 371 as the National Stage of International Application No. PCT/SG2014/000097, filed Feb. 28, 2014, entitled "A CAPACITIVELY COUPLED ELECTRODELESS PLASMA APPARATUS AND A METHOD USING CAPACITIVELY COUPLED ELECTRODELESS PLASMA FOR PROCESSING A SILICON SUBSTRATE", which claims the benefit of and priority to U.S. Provisional Patent Application No. 61/770,737, filed Feb. 28, 2013, and 61/834,217, filed Jun. 21, 2013 both of which are incorporated herein by reference in their entirety for all purposes.

FIELD OF INVENTION

The invention relates to a capacitively coupled electrodeless plasma apparatus and method using capacitively coupled electrodeless plasma for processing a silicon substrate.

BACKGROUND

Plasma is extensively utilized in industries for material processing such as deposition of thin films, etching, ion-implantation and modification of surface morphology as well as surface properties. Once a plasma discharge is initiated, electrons in the plasma can build up their energy easier and faster as compared to other particles of large mass. The energetic electrons in the plasma can assist to further ionize and dissociate feedstock gas for production of desired radicals as well as plasma sustenance. The radicals will then be transported onto the substrate for surface reaction. Hence, a low substrate-temperature process is allowed with the aid of plasma and this feature is always in demand for processing of temperature-sensitive material. Plasma enhanced chemical vapor deposition (PECVD) with parallel plates is commonly used especially in low temperature semiconductor manufacturing for conformal deposition of thin film, while inductively coupled plasma (ICP) is commonly used especially in low-temperature etching process.

Ion bombardment is necessary for all plasma processing and it will create mechanical damage on the surface of substrate and correspondingly degrade the performance of the device. Reducing ion damage on the substrates will improve the quality of the material processing and consequently, the performance of the fabricated devices. Competition among manufacturers of semiconductor devices has led to increased demand for soft plasma processing since the performance of the devices can be significantly improved without substantial increase in manufacturing cost. Typically, low ion bombardment can be possible by reducing ion density, ion energy and ion acceleration on to the substrate. For example, in the remote-plasma method can be employed as the substrate is located outside the plasma for reduction of the ion density in the vicinity. Alternatively, reactive plasma deposition (RPD) developed by Sumitomo Heavy Industry [1], utilizes magnetism to control the movement of ions for synthesis of low-defect transparent and conducting oxide (TCO) thin films.

In photovoltaic industries, silicon wafer-based solar cells have more than 90% market share. It is desirable if the silicon wafer-based solar cells are able to improve conversion efficiency while reducing manufacturing cost to ensure that solar energy becomes more cost competitive compared to the wholesale rate of electricity. Currently, the cost of the silicon substrate takes up approximately 55% of the total manufacturing cost for a silicon solar cell.

During large-scale production of silicon wafer-based solar cells, while it is desirable to reduce a thickness of a substrate up to the theoretical limit (80 μm) for saving the amount of material being used, a major barrier to do so stems from limitations of present wet etching techniques. Wet etching on both surfaces of the silicon substrate (i.e. double side texturing) leads to a thicker silicon substrate layer which is undesirable. Black silicon, consisting of various nano-scale structures (such as pillars, cones, spikes and so on) after texturing, is desirable for high efficiency photovoltaic cells due to its ultra-low reflectance over a broad spectrum (300 to 1000 nm). Unfortunately, there are few ways available for preparation of black silicon with reflectivity lower than 10%. Many methods such as wet etching [2], femtosecond laser pulse [3], reactive ion etching [4] and deep reactive ion etching (DRIE) [5] are not cost effective. Such black silicon typically features textured surface of high aspect ratio which will affect the subsequent solar cell processes such as, for example, junction formation, surface passivation, metallization, and the like. Moreover, a resultant increase in dangling bond density on the surface after etching will deteriorate the minority carrier lifetime in c-Si. Such issues adversely limit the usage of black silicon in high efficiency thin silicon wafer solar cells.

Unpassivated dangling bonds on the surface of the absorber layer leads to high surface recombination velocity and hence deteriorate the conversion efficiency of solar cells. In order to achieve high efficiency in a c-Si based solar cell, surface passivation of c-Si is necessary. There are two ways to passivate the c-Si surface, namely, field-effect passivation (where an extra electric field is provided for reduction of the carrier density at the surface) and chemical passivation (where the dangling bonds are directly saturated). Materials with static charges such as amorphous silicon carbide (SiCx), silicon oxide (SiOx), silicon nitride (SiNx) and aluminum oxide (AlOx) exhibit strong field passivation effect but can only passivate one side of a c-Si solar cell as otherwise, formation of reverse field will deteriorate open circuit voltage. Thus, different synthesis methods are necessary for front and rear side passivation and this leads to significant increases in manufacturing cost for high efficiency c-Si solar cells. As such, use of intrinsic amorphous hydrogenate silicon (a-Si:H) thin films of ideally no static charge and which have superb chemical passivation, will be more industrially advantageous than dual-side passivation. a-SiH thin films are typically used in SANYO heterojunction with intrinsic thin layer (HIT) solar cell production line for dual-side passivation of n-type c-Si.

Plasma enhanced chemical vapor deposition (PECVD) is currently the predominant method applied in industry for low temperature synthesis of a-Si:H thin films. Normally, a subsequent low temperature thermal annealing process (<400° C.) is required to repair interface structure for activation of surface passivation. For PECVD, the thermal annealing generally takes more than ten hours in order to saturate the passivation effect. Increasing the annealing temperature above 400° C. can shorten the thermal annealing time but this results in effusion of hydrogen and thereby limits the saturation of dangling bonds. Thus, in order to achieve both sub-hour thermal annealing and more desirable passivation effect, a defect-free synthesis process, where the interface structure is less damaged, is preferable. It is unlikely that effective minority carrier lifetime ($\tau_{eff}$) of higher than 2.5 ms in c-Si passivated by PECVD synthesized a-Si:H thin films with sub-hour thermal annealing is possible due to high ion bombardment attributed to inherently high sheath potential in PECVD.

SUMMARY

In a first aspect, there is provided a capacitive coupled electrodeless plasma apparatus for processing a silicon substrate. The apparatus includes at least one inductive antenna driven by time-varying power sources for providing at least one electrostatic field; and a chamber for locating the silicon substrate. It is advantageous that the at least one electrostatic field induced by a potential drop across the at least one inductive antenna is for breakdown of feedstock gases and sustenance of discharge in the chamber.

Preferably, the chamber is for placement of the at least one inductive antenna with isolation of the inductive antenna being enabled using at least one dielectric window. The inductive antenna can be in a configuration such as, for example, planar spiral configuration, cylindrical configuration, coil configuration and so forth. It is desirable that the selected configuration enables control of ion motion.

A potential drop across the inductive antenna is dependent on both an inductance of the antenna and a frequency of RF power. Preferably, the silicon substrate is set at a floating potential to reduce ion energy. The silicon substrate can be of either a single-crystalline or a multi-crystalline form.

The silicon substrate can be processed in a manner such as, for example, deposition of at least one thin film, etching and modification of surface morphology, etching and modification of surface properties and so forth. The deposition of at least one thin film can be carried out on at least one side of the substrate; carried out at room temperature; carried out with post thermal activation treatment of <400° C.; carried out with annealing time of <1 hour; or carried out using any combination of the aforementioned.

In a second aspect, there is provided a method for processing a silicon substrate using capacitively coupled electrodeless plasma. The method includes locating the silicon substrate in a chamber; and providing at least one electric field using at least one inductive antenna driven by time-varying power sources. Preferably, the at least one electric field induced by a potential drop across the at least one inductive antenna is for breakdown of feedstock gases and sustenance of discharge in the chamber.

The method can further include setting the silicon substrate at a floating potential, and also selecting a configuration of the at least one inductive antenna to enable control of ion motion.

The silicon substrate can be processed in a manner such as, for example, deposition of at least one thin film, etching and modification of surface morphology, etching and modification of surface properties and so forth. Preferably, the deposition of at least one thin film can be carried out on at least one side of the substrate; carried out at room temperature; carried out with post thermal activation treatment of <400° C.; carried out with annealing time of <1 hour; or carried out using any combination of the aforementioned.

DESCRIPTION OF FIGURES

In order that the present invention may be fully understood and readily put into practical effect, there shall now be described by way of non-limitative example only preferred embodiments of the present invention, the description being with reference to the accompanying illustrative figures.

FIG. 9 shows a table summarizing key differences and advantages for various forms of texturing.

DESCRIPTION OF PREFERRED EMBODIMENTS

Figure 1A:
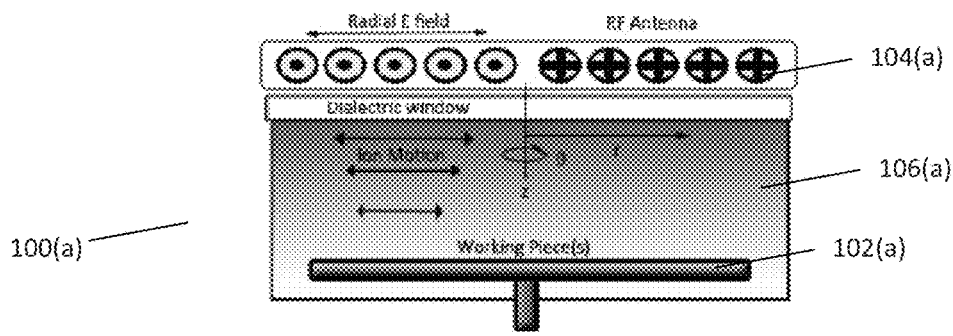
FIGS. 1(a) to (d) show various directions and magnitudes of electric fields for various configurations of inductive antennae.
Figure 1B:
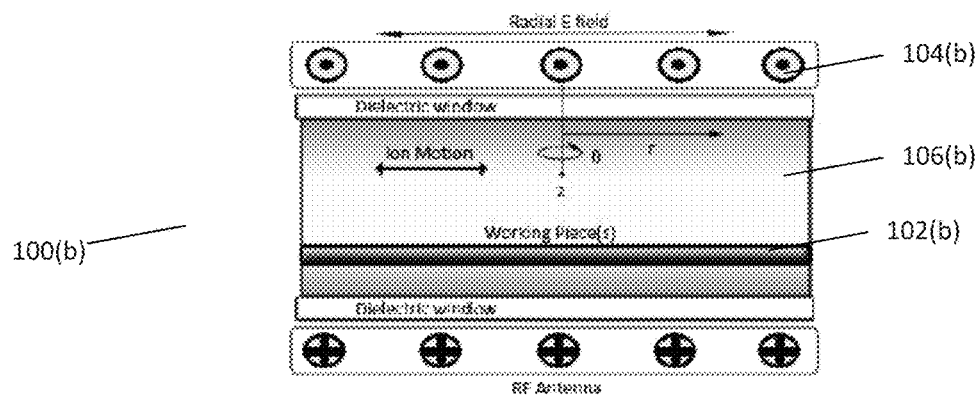
Figure 1C:
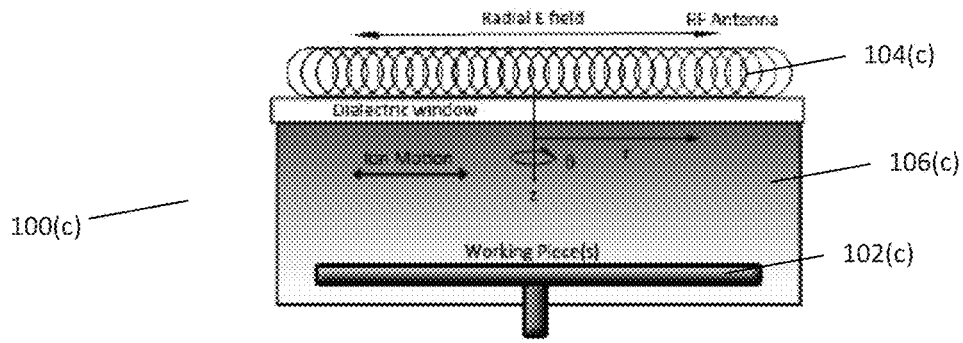
Figure 1D:
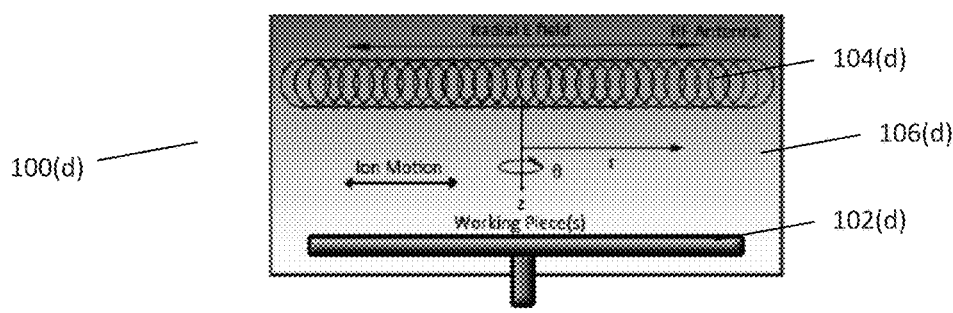

The preferred embodiments of the present invention provide soft plasma processing, using capacitively coupled electrodeless plasma (CCEP), which utilizes electric fields associated with potential drop across inductive antennas to breakdown the working gases and initiate the plasma. Applications of CCEP are also provided.

Inductive antenna is typically used in inductive coupled plasma (ICP) apparatus for discharge of high density plasma by induced electric field. One of the reasons for using inductive antenna in CCEP is that the potential drop across the antenna, which depends on an inductance of the antenna and a frequency of RF power, is high. High potential drop across the antenna will result in a capacitively coupled electric field which is undesirable and should be screened in the state-of-the-art ICP. However, such high potential drop can be utilized for efficient capacitively coupled plasma processing, particularly for material processing.

The ion energy can be independently controlled by external bias applied onto working piece(s). As shown in FIG. 1 which shows various embodiments of a CCEP apparatus 100 for processing a silicon substrate, the working piece(s) 102 can be set at floating potential to reduce sheath potential or ion energy. An inductive antenna 104 can be placed inside or outside a chamber 106 by isolation using dielectric window(s) which can be made of, for example, quartz, alumina and the like. CCEP is desirable as it results in significantly lower bombardment of ions onto the working piece(s) during plasma processing as compared to PECVD and ICP. FIG. 1 shows inductive antennae 104 of different configurations which produces different electric fields. FIG. 1(*a*) shows an inductive antenna 104(*a*) of planar spiral configuration, FIG. 1(*b*) shows an inductive antenna 104(*b*) of cylindrical configuration, FIG. 1(*c*) shows an inductive antenna 104(*c*) of coil configuration (outside chamber 106(*c*)) while FIG. 1(*d*) shows an inductive antenna 104(*d*) of coil configuration (inside chamber 106(*d*)). It is noted that CCEP discharge allows control of ion motion (or induced electric field) via inductive antennae design. Low ion bombardment can be achieved in CCEP by controlling a direction of ion motion so that the ions do not vertically bombard a surface of the working piece(s). This minimises damage to the surface of the working piece(s).

In contrast with conventional capacitively coupled plasma (CCP) which comprises electrode plates, the CCEP comprises at least an inductive antenna 104, driven by time-varying power sources (such as RF, pulsed DC, etc.), to provide electric fields induced by a potential drop across the antenna for breakdown of feedstock gases and sustenance of discharge in a chamber. The potential difference across the antenna(s), which depends on the inductance of the antenna(s) and frequency of the time-varying power sources, is significantly larger than that across parallel electrode plates under same power density. This allows capacitive plasma of much larger volume, higher utilization rate of gas and no electrodes in the plasma. As shown in FIGS. 1(*c*) and 1(*d*) respectively, the antenna 104 can be placed inside or outside the chamber by isolation of dielectric window(s). The dielectric window can increase the durability of the inductive antenna(s) 104, improve the stability of the discharges and widen the process window as well as minimize the ion impact. The power coupling can be controlled by varying the dielectric window/air gap while direction and magnitude of the electric fields can be varied depending on a configuration of the inductive antenna(s) 104 as shown in FIG. 1. For example, in FIG. 1(*a*), the inductive antenna 104(*a*) is in a planar spiral configuration and placed on the top of chamber 106(*a*) so that the direction of the electrostatic field and ion motion is predominately parallel with the surface of the working piece(s) 102(*a*). This reduces ion bombardment onto the working piece(s) 102(*a*) and is akin to the working pieces(s) 102(*a*) being outside of the ion plasma. In this regard, the ion energy can be independently controlled by external bias applied onto the working piece(s) and the working piece(s) can be set at floating potential to reduce sheath potential/ion energy.

In contrast with the conventional ICP where the transfer of power is by inductive coupling, CCEP operates in relatively lower power density region so that the ion density and ion acceleration is significantly lower which result in significant lower ion damage on the substrate. As such, CCEP can be utilized for all kind of industrial-scale soft plasma processing such as, for example, deposition of thin film, etching, ion-implantation, modification of surface morphology/surface properties and the like.

CCEP can be utilized for all kind of industrial-scale soft plasma processing including deposition of at least one thin film (such as surface passivation of silicon wafers, antireflective coating, growth of absorber layers for thin film solar cells, formation of emitter for heterojunction-with-intrinsic thin layer or HIT solar cells, etc.), etching and modification of surface morphology (such as soft texturing of silicon wafers, glasses, etc.) as well as surface properties (such as soft plasma polymerization, etc.). In addition to ultra-low ion bombardment, CCEP combines the commercial advantages of both ICP and PECVD such as, for example, capacitively coupled plasma discharge of larger volume, better utilization of feedstock gas, independent control of ion energy onto substrate as well as no electrodes in the plasma. Hence, CCEP has advantages over other industrial plasma processing techniques and has potential to replace them for fabrication of defect-sensitive materials or devices such as solar cells, integrated circuits, very small devices in microelectromechanical systems (MEMS), etc.

Compared to conventional CCP, CCEP allows capacitive plasma of much larger volume (which is beneficial for large-scale plasma processing), higher utilization rate of gas (which reduces cost of gas usage), no need for electrodes in the plasma (which improves stability of the discharges), wider processing window (which improves yield of processing), independent control of ion energy (which enables a variety of plasma processing such as, for example, deposition, etching, ion-implantation, and so forth) and significantly lower ion bombardment onto the substrates (which improves performance of the fabricated devices). Moreover, compared to conventional ICP, ion density and acceleration are much lower in CCEP and thus, ion bombardment onto the substrate is also much lower.

There are two types of wet texturing typically used for fabricating 180 μm silicon solar cells. They are alkaline wet texturing for single-crystalline silicon solar cells and acidic wet texturing for multi-crystalline silicon solar cells. Wet texturing typically requires excessive water usage to remove unwanted residue after texturing but the acidic residue at the grain-boundaries cannot be removed completely and this leads to light induced degradation (LID) issues in multi-crystalline silicon solar cells. In view of the emergence of 80 μm thin silicon wafer dicing technology, migration from the current 180 μm silicon wafer based solar cell technology to the 80 μm one is likely in the near future because it would lead to reduction of solar cell price. Unfortunately, existing wet texturing processes do not allow one-sided processing, and thus are not able to be adapted for the manufacturing of thin (80 μm) silicon solar cells.

Figure 2:
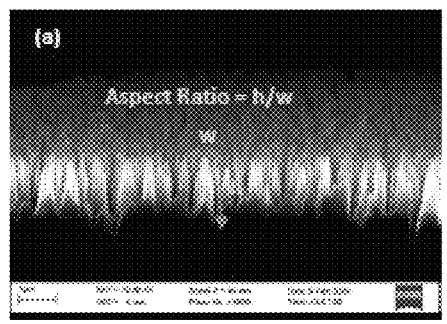
FIG. 2 shows high aspect ratio textured profiles by multi-step reactive ion etching.
Figure 3:
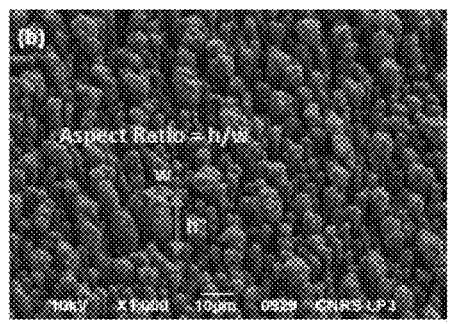
FIG. 3 shows high aspect ratio textured profiles by femtosecond lasers.

In view of the limitations of wet texturing processes, dry texturing processes, featuring residue-free and one-sided processing, have to be developed for upcoming thin or multi-crystalline silicon solar cell manufacturing. To date, no dry texturing process has been commercialized. There are various dry texturing methods such as multi-step reactive ion etching (high aspect ratio textured profiles shown in FIG. 2), femtosecond lasers (high aspect ratio textured profiles shown in FIG. 3), reactive ion etching and deep reactive ion etching, and so forth. They can achieve even black-silicon-level reflectance (<5%) over broad spectrum (300-1100 nm) on silicon wafers but they are still not able to improve the overall solar cell efficiency due to the high-aspect-ratio textured profile (as depicted in FIGS. 2 and 3) and substantial high surface damage.

Figure 4:
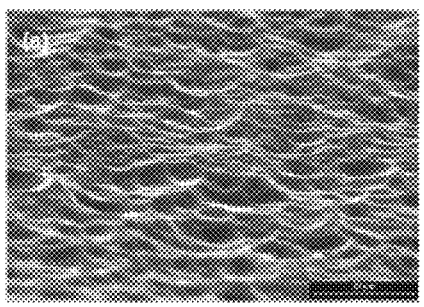
FIG. 4 shows texturing profile produced by microwave-driven inductive-coupled plasma using $SF_6$.
Figure 5:
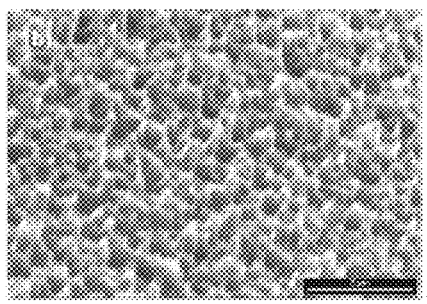
FIG. 5 shows texturing profile produced by microwave-driven inductive-coupled plasma using $SF_6$ and $N_2O$.

FIG. 4 shows a texturing profile produced by microwave-driven inductive-coupled plasma (MW-ICP) which uses $SF_6$ as an etchant gas, while FIG. 5 shows a texturing profile produced by microwave-driven inductive-coupled plasma (MW-ICP) which uses $SF_6$ as an etchant gas and $N_2O$ as passivated gas. The light reflectance for these wafers can reach below 10% which is better than wafers obtained by wet texturing (20-40%) but there is still no significant improvement in cell efficiency as compared to wet texturing due to the inherently high ion-bombardment during the plasma processing.

Figure 6:
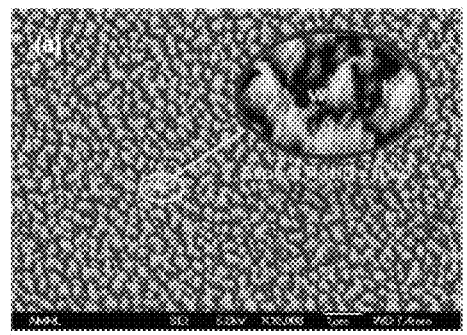
FIG. 6 shows SEM textured profile produced by capacitively coupled electrodeless plasma using $SF_6$ only on a single-crystalline silicon wafer.

In addition to the almost bombardment-free plasma processing, CCEP texturing can produce low-density nano-cone array of nearly 1:1 aspect ratio using $SF_6$ (etchant gas) only. In contrast with the MW-ICP, no passivated gas (such as $N_2O$) is used in the CCEP (as shown in FIG. 6) where micro-masking effect of the weakly-dissociated $SF_x$ particles is sufficient for a high texture size (comparing FIGS. 4 and 6). This enables elimination of oxide residues forming during the MW-ICP texturing and hence no extra step is required to remove the residues after texturing which aids in longer material stability.

CCEP texturing makes no selectivity on single- and multi-crystalline silicon wafers. The periodicity, diameter and height of nano-cones approximately extracted from SEM images (FIG. 6) are 280 nm, 240 nm and 240 nm respectively and the aspect ratio of the nano-cones is near to 1:1 on both types of wafer. Thus, identical recipes can be used for both single- and multi-crystalline silicon solar cells. This kind of flexibility greatly widens the potential market of the CCEP technology in solar industries where the solar cell manufacturers can process both types of silicon solar cells without incurring extra investment cost.

Figure 7:
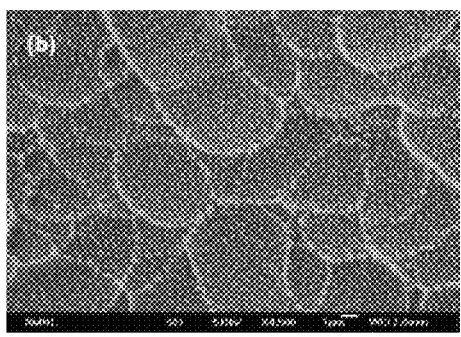
FIG. 7 shows SEM textured profile produced by capacitively coupled electrodeless plasma using $SF_6$ only on a multi-crystalline silicon wafer.
Figure 8:
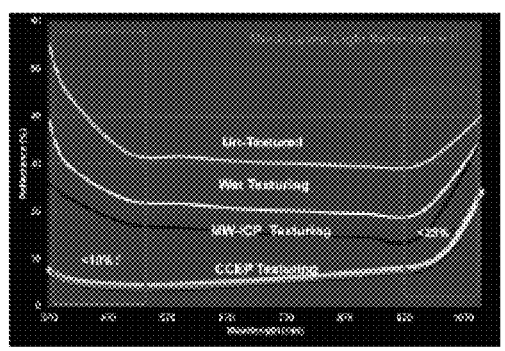
FIG. 8 shows comparison graphs of light reflectance over an entire solar spectrum for various forms of texturing.

As texturing reduces the light reflectance of the surface, research was carried out on the light reflectance of the single- and multi-crystalline silicon wafers after the CCEP texturing using a UV/VIS spectrometer (Lambda 950 from Perkin Elmer). In spite of low aspect ratio and density as shown in FIGS. 6 and 7, this type of nano-cone array is able to give 4-25% reflectance over the entire solar spectrum (300-1100 nm) for both types of wafers as shown in FIG. 8. As shown in FIG. 8, low reflectance with low aspect ratio has been achieved with CCEP texturing.

As described earlier, an apparatus of CCEP comprises at least an inductive antenna coil to provide high electric field for breakdown of feedstock gases and sustenance of plasma in a chamber. The apparatus enables low density plasma discharge of large volume, making it compatible with streamlined production. The configuration of the RF antenna is designed so that the direction of the electric field and ion motion is parallel with the surface of the substrate holder, i.e. the perpendicular ion motion is mostly due to slow diffusion only which results in lower ion bombardment onto substrate. Black silicon consisting of low-aspect-ratio (nearly 1:1) nano-cones with the reflectance below 10% is prepared in CCEP using $SF_6$ feedstock gas only at room temperature. The etching gas comprises at least a halogen-containing gas such as, for example, $SF_6$, $CF_4$, $Cl_2$, and the like. The low-aspect-ratio texture profile is formed by chemical etching of neutral radicals in CCEP, followed by re-deposition of the etched silicon. The chemical etching is governed by the ion bombardment level in the plasma. High ion bombardment will result in mechanical etching. This will lead to flat polished surface (if there is no mask or passivated gas) or high aspect ratio (if there is mask or passivated gas).

Figure 10A:
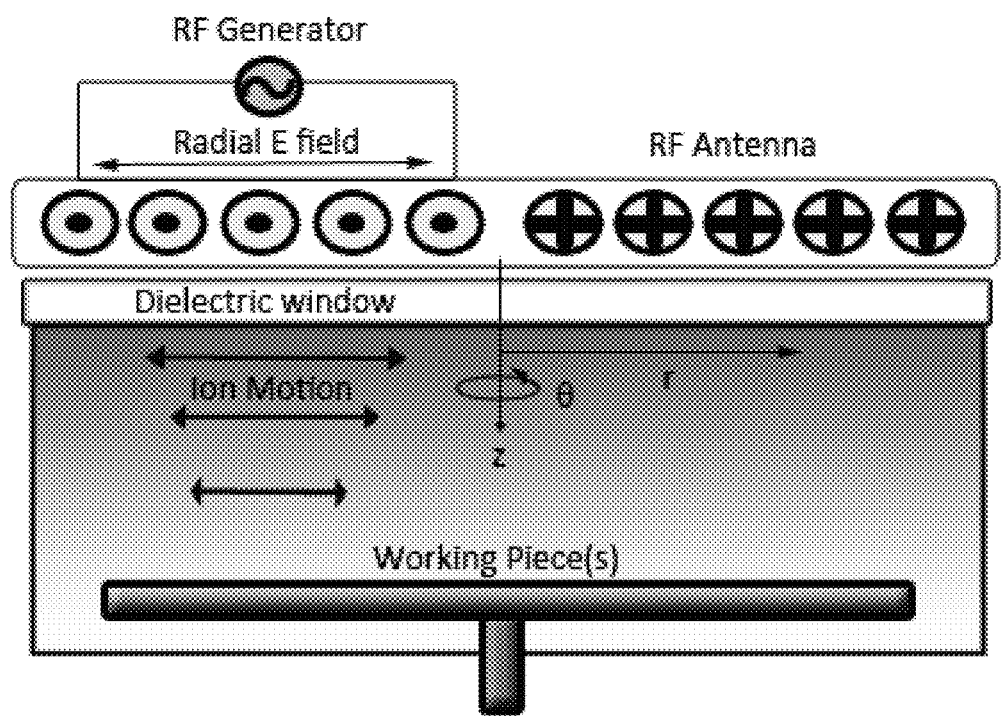
FIG. 10(a) shows a schematic view of a capacitively coupled electrodeless plasma setup and 10(b) shows a schematic view of a plasma enhanced chemical vapor deposition setup for surface passivation, both views showing ion motion.

The low-temperature deposition of a-Si:H thin films for surface passivation by PECVD results in higher ion bombardment onto the processing pieces and hence the synthesized films will have more defects and lower density. When CCEP is employed for surface passivation, there is large volume capacitive discharge of negligible ion bombardment, resulting in synthesis of fewer defects and higher quality. As shown in FIG. 10, one of the key differences between use of PECVD and CCEP is the direction of electric field (or ion motion). In CCEP, ion motion is predominantly parallel to the surface of the working pieces (as shown in FIG. 10(a)).

When using CCEP for surface passivation, advantages include:

Simultaneous Dual-Side Surface Passivation

In contrast with the PECVD of narrowly confined plasma volume, CCEP is of large volume of gas discharge allowing vertical orientation and free rotation of the processing pieces. This makes dual-side surface passivation possible in one-step plasma processing.

Room-Temperature Plasma Processing

Unlike other surface passivation methods, room-temperature plasma processing followed by sub-hour low temperature annealing can produce desirable passivation quality. A CCEP approach is more preferable in industrial use due to cost-savings in relation to thermal budget.

High Effective Minority Carrier Lifetime/Passivation Quality

The passivation quality of the synthesized thin film is determined by the ion bombardment level in the plasma whereby high ion bombardment results in damage creation/deterioration of the passivation quality of thin films. Due to lower ion bombardment in CCEP processing, less defects will be resulted and thus higher effective minority carrier lifetime can be obtained after post thermal activation treatment (<400° C.).

Short Post Thermal Annealing Time

Post thermal activation treatment can improve the passivation quality. Due to low defect density, short annealing time (<1 hour) is required for CCEP-synthesized a-Si:H thin films to reach the highest limit of the passivation quality. This high throughput process is desirable in photovoltaic industries.

In view of the aforementioned advantages, a low temperature synthesis method, to fabricate low-defect and high-density passivation layer such as amorphous hydrogenate silicon thin films (a-Si:H) for surface passivation of cystalline silicon (c-Si), is disclosed. Silane or mixture of silane and hydrogen feedstock gas is used during CCEP synthesis of a-Si:H thin films. Effective minority carrier lifetime of above 2.5 ms after sub-hour thermal annealing (<400° C.) is achievable using this method.

Figures 10B, 11:
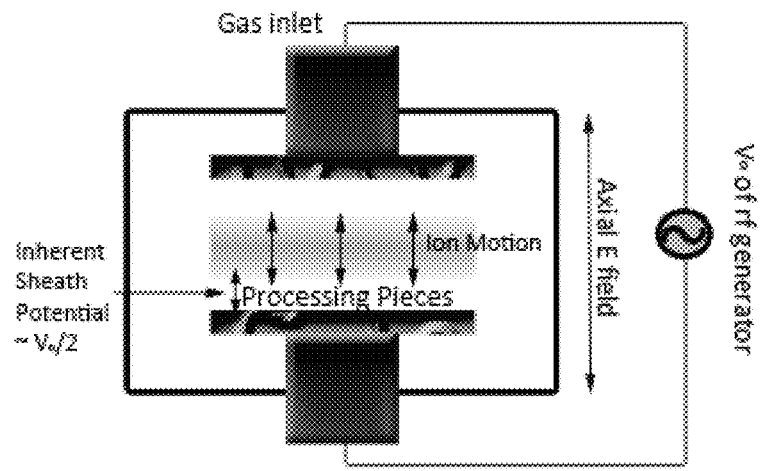
FIG. 11 shows a table denoting operating parameters for CCEP synthesis of a-Si:H thin films.

An example of CCEP of planar spiral configuration for coating of a-Si:H passivative layers will now be provided for illustrative purposes. A 500 kHz radio-frequency (RF) driven source with dynamic power output of 50 to 4000 W is utilized to drive the flat spiral coil through a matching network. Highly-uniform plasma is generated in a low-aspect-ratio, stainless-steel-walled rectangular vacuum chamber with width W=60 cm, length L=100 cm, and height H=40 cm. The chamber allows plasma-processing of four pieces of 5-inch silicon wafer simultaneously. The transfer of RF power from the planar spiral coil to plasma is predominantly by capacitive coupling. The capacitively-coupled electric field is originated from the radial potential drop across the two ends of the planar induction coil. Other operational parameters are shown in FIG. 11 and the electron density is of the order of magnitude of $10^9$-$10^{11}$ cm$^{-3}$.

By using RF input power of 300 W, working pressure of 7 Pa and gas ratio (i.e. $SiH_4$:$H_2$) of 6.5:25 sccm, 40 nm intrinsic a-Si:H thin films were deposited on both sides of n-type Czochralski c-Si, in which the crystallographic plane is (1 1 1) and resistivity is 4.7 to 5.2 Ωcm, at room temperature followed by 300° C. annealing for 30 min. The effect of surface passivation is characterized by the effective surface recombination velocity. Assuming an infinite bulk lifetime, the upper limit of the effective surface recombination velocity ($S_{eff}$) can be calculated by $$S_{eff} \leq \frac{t}{2\tau_{eff}}, \quad \text{(Eq. 1)}$$

where t is a thickness of silicon wafer (270±20 μn) and $\tau_{eff}$ is the effective minority carrier lifetime measured by means of the Quasi Steady-State Photoconductance (QSSPC) method, at an injection level of $10^{15}$ cm$^{-3}$, using the quasi transient mode and the generalized mode.

An effective minority lifetime of 2.56 ms can be obtained after only 30 min thermal annealing. This shows the advantages of CCEP to compared to PECVD in relation to performance (i.e. higher effective minority carrier lifetime/passivation quality) and higher throughput (i.e. shorter thermal annealing time, larger discharge volume for large-scale processing and simultaneous dual-side surface passivation).

As such, solar cell manufacturers can apply a CCEP process to replace wet texturing processes, for both the current 180 μm and the upcoming thinner silicon solar cell manufacturing with the following advantages:
One-side texturing for thin silicon wafers (<180 μm);
No water usage for environmental and power benefits;
Improved material stability without the residual contamination from wet etching processes that affect long term performance of the solar cell;
Direct application to both single and multi-crystalline Si for lower cost impact resulting from changes;
Better light absorption for higher efficiency of the solar cell; and
Highly controllable and fully-automated plasma texturing process.

Figure 12:
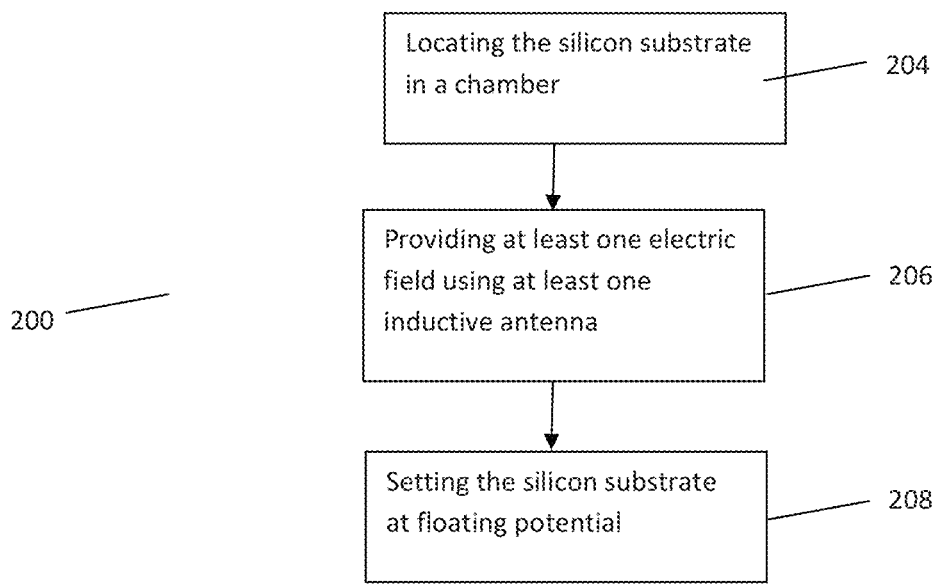
FIG. 12 shows a flow chart for a method for processing a silicon substrate using CCEP.

Referring to FIG. 12, there is shown a method 200 for processing a silicon substrate using capacitively coupled electrodeless plasma. The method 200 includes locating the silicon substrate in a chamber (204), and providing at least one electric field using at least one inductive antenna (206) driven by time-varying power sources. The at least one inductive antenna can be located either inside or outside the chamber. The at least one inductive antenna can be in a configuration such as, for example, planar spiral configuration, cylindrical configuration, coil configuration and so forth. The configuration of the at least one inductive antenna is also to ensure that ion motion (which follows the induced electric field) is not parallel to a normal of the surface of the silicon substrate. This reduces the direct vertical bombardment of ions onto the silicon substrate. It should be appreciated that the at least one electric field is induced by a potential drop across the at least one inductive antenna for breakdown of feedstock gases and sustenance of discharge in the chamber.

The method 200 can further include setting the silicon substrate at floating potential (208) so as to minimise ion energy, and correspondingly, ion damage on a surface of the silicon substrate. Using the method 200 enables the silicon substrate to be processed in a manner such as, for example, deposition of at least one thin film, etching and modification of surface morphology, etching and modification of surface properties and so forth. When the deposition of at least one thin film is applied onto the silicon substrate, the deposition can be carried out on front side, rear side or both sides of the substrate, carried out at room temperature, carried out with post thermal activation treatment of <400° C., carried out with annealing time of <1 hour, or carried out using any combination of the aforementioned.

It should be appreciated that the method 200 enables silicon substrates to be processed with advantages enabled by use of a CCEP process as mentioned in the preceding paragraphs.

Whilst there have been described in the foregoing description preferred embodiments of the present invention, it will be understood by those skilled in the technology concerned that many variations or modifications in details of design or construction may be made without departing from the present invention.

REFERENCES 1. http://www.shi.co.jp/english/products/semicon/vacuum/index.html
2. Howard M. Branz, Vernon E. Yost, Scott Ward, Kim M. Jones, Bobby To and Paul Stradinset, "Nanostructured black silicon and the optical reflectance of graded-density surfaces", Applied Physics Letters, vol. 94, 23 (2009).
3. M. Y. Shen, C. H. Crouch, J. E. Carey and E. Mazur, "Femtosecond laser-induced formation of submicrometer spikes on silicon in water", Applied Physics Letters, vol. 85, 23 (6 Dec. 2004).
4. B. M. Damiani, R. Lüdemann, D. S. Ruby, S. H. Zaidi, A. Rohatgi, "Development of RIE-textured silicon solar cells", Photovoltaic Specialists Conference, 2000. Conference Record of the Twenty-Eighth IEEE, pp. 371-374 (15-22 Sep. 2000).
5. H. Jansen et al, "The black silicon method. VIII. A study of the performance of etching silicon using SF6/O2-based chemistry with cryogenical wafer cooling and a high density ICP source," Microelectronics Journal, vol. 32, pp. 769-777 (2001).
6. S. Xu, C. S. Chan and L. X. Xu, "Capacitive Coupled Electrodeless Plasma (CCEP) For Soft Plasma Processing", U.S. Provisional Patent Application 61/770,737.

The invention claimed is:
1. A capacitive coupled electrodeless plasma apparatus for processing a silicon substrate, wherein capacitive coupled refers to a potential drop across at least one inductive antenna comprised in the apparatus and wherein electrodeless refers to an absence of electrodes in a plasma generated in a chamber of the apparatus, the apparatus comprising:
the at least one inductive antenna driven by time-varying power sources for providing at least one electrostatic field, the at least one inductive antenna being configured to enable control of ion motion parallel to a surface of the silicon; and
the chamber for locating the silicon substrate,
wherein the at least one electrostatic field induced by the potential drop across the at least one inductive antenna is for breakdown of feedstock gases and sustenance of discharge in the chamber.
2. The apparatus of claim 1, wherein the chamber is for placement of the at least one inductive antenna with isolation of the inductive antenna being enabled using at least one dielectric window.
3. The apparatus of claim 2, wherein the inductive antenna is in a configuration selected from a group consisting of: planar spiral configuration, cylindrical configuration and coil configuration.
4. The apparatus of claim 1, wherein a potential drop across the inductive antenna is dependent on both an inductance of the antenna and a frequency of RF power.

5. The apparatus of claim 1, wherein the silicon substrate is of either a single-crystalline or a multi-crystalline form.

6. The apparatus of claim 1, wherein the silicon substrate is processed in a manner selected from a group consisting of: deposition of at least one thin film, etching and modification of surface morphology, and etching and modification of surface properties.

7. The apparatus of claim 6, wherein the deposition of at least one thin film can be:
- carried out on at least one side of the substrate;
- carried out at room temperature;
- carried out with post thermal activation treatment of <400° C.;
- carried out with annealing time of <1 hour; or
- carried out using any combination of the aforementioned.

8. The apparatus of claim 1, wherein the silicon substrate is set at a floating potential to reduce ion energy.

9. The apparatus of claim 1, wherein a frequency of the time-varying power sources is 500 kHz.

10. A method for processing a silicon substrate using a capacitive coupled electrodeless plasma apparatus, wherein "capacitive coupled" refers to a potential drop across at least one inductive antenna comprised in the apparatus and wherein "electrodeless" refers to an absence of electrodes in a plasma generated in a chamber of the apparatus, the method comprising:
- locating the silicon substrate in the chamber;
- providing at least one electric field using the at least one inductive antenna driven by time-varying power sources; and
- selecting a configuration of the at least one inductive antenna to enable control of ion motion parallel to a surface of the silicon substrate;
- wherein the at least one electric field induced by a potential drop across the at least one inductive antenna is for breakdown of feedstock gases and sustenance of discharge in the chamber; and
- wherein the time-varying power sources are operated up to an upper limit such that an electron density of the discharge is of an order of magnitude of $10^9$ -$10^{11}$ cm$^{-3}$.

11. The method of claim 10, further including setting the silicon substrate at a floating potential.

12. The method of claim 10, wherein the silicon substrate is processed in a manner selected from a group consisting of: deposition of at least one thin film, etching and modification of surface morphology, and etching and modification of surface properties.

13. The method of claim 12, wherein the deposition of at least one thin film can be:
- carried out on at least one side of the substrate;
- carried out at room temperature;
- carried out with post thermal activation treatment of <400° C.;
- carried out with annealing time of <1 hour; or
- carried out using any combination of the aforementioned.

14. The method of claim 10, wherein a frequency of the time-varying power sources is 500 kHz.

* * * * *